(12) United States Patent
Hoshino et al.

(10) Patent No.: US 9,246,385 B2
(45) Date of Patent: Jan. 26, 2016

(54) SWITCHING POWER CONTROL CIRCUIT

(71) Applicant: Rohm Co., Ltd., Kyoto (JP)

(72) Inventors: Kiyoaki Hoshino, Kyoto (JP); Hirokazu Oki, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 14/585,919

(22) Filed: Dec. 30, 2014

(65) Prior Publication Data

US 2015/0194978 A1 Jul. 9, 2015

(30) Foreign Application Priority Data

Jan. 6, 2014 (JP) ................... 2014-000396

(51) Int. Cl.
*H02M 3/156* (2006.01)
*H03M 1/12* (2006.01)
*G05B 11/42* (2006.01)

(52) U.S. Cl.
CPC ............... *H02M 3/156* (2013.01); *H03M 1/12* (2013.01); *G05B 11/42* (2013.01)

(58) Field of Classification Search
None
See application file for complete search history.

(56) References Cited

U.S. PATENT DOCUMENTS

| | | | |
|---|---|---|---|
| 7,117,044 B2 * | 10/2006 | Kocher et al. | 700/34 |
| 7,428,159 B2 * | 9/2008 | Leung et al. | 363/95 |
| 7,622,820 B1 * | 11/2009 | Prodic et al. | 307/31 |
| 8,030,910 B2 * | 10/2011 | Lima et al. | 323/282 |
| 2013/0113449 A1 * | 5/2013 | Pietri et al. | 323/283 |

FOREIGN PATENT DOCUMENTS

| | | |
|---|---|---|
| JP | 2012-044801 | 3/2012 |
| JP | 2012-110108 | 6/2012 |
| JP | 2013-188084 | 9/2013 |

OTHER PUBLICATIONS

Xantrex Inc., Santrex Prosine Sine Wave Inverter 1000/1800 Owner's Manual, Jan. 2009 rev. B p. 10.*

* cited by examiner

*Primary Examiner* — Howard Williams
(74) *Attorney, Agent, or Firm* — Fish & Richardson P.C.

(57) ABSTRACT

A switching power control circuit includes an analog-to-digital converter (ADC) configured to convert an analog direct current (DC) voltage into a digital voltage; a digital compensator configured to set a gain and phase characteristics of the digital voltage output from the ADC and output a digital compensation value; and a pulse generating circuit configured to generate at least one driving signal based on the digital compensation value, wherein the pulse generating circuit is switched by an ON/OFF signal for turning on or off an output of the driving signal from the pulse generating circuit and a control scheme selection signal for selecting a predetermined driving signal from the driving signal.

16 Claims, 12 Drawing Sheets

940

SWITCHING POWER CONTROL CIRCUIT

CROSS-REFERENCE TO RELATED APPLICATIONS

This application is based upon and claims the benefit of priority from Japanese Patent Applications No. 2014-000396, filed on Jan. 6, 2014, the entire contents of which are incorporated herein by reference.

TECHNICAL FIELD

The present disclosure relates to a switching power control circuit for switching a control scheme of a switching power supply device.

BACKGROUND

Recently, two-way switching power control circuits are installed in electric vehicles, hybrid vehicles, and the like in order to charge electric power generated by photovoltaic power generation and supply charged electric power to households, or the like as needed.

There exists a switching power supply device for performing a two-way power interchange. In the switching power supply device, a full bridge circuit is connected to a primary side of a transformer while a push-pull circuit is connected to a secondary side thereof. The full bridge circuit may perform a switching operation using a phase shift signal.

Further, an isolated DC/DC converter is used. The isolated DC/DC converter is configured such that an operation (or control) of a switching element is switched between a full bridge and a half bridge by a microcomputer. Also, the switching element constituting the full bridge and the half bridge is connected to a primary winding side of a transformer. Thus, switching of the full bridge and the half bridge may be performed by the primary winding side of the transformer. That is to say, in the isolated DC/DC converter, a driving scheme of a secondary winding side of the transformer may not be switched.

In addition, a compact, highly efficient DC/DC converter is also used. In such a converter, a plurality of control schemes such as a full bridge two-way isolated DC/DC converter, a flyback converter, a series converter using a polarity reversing chopper, and a one-way isolated DC/DC converter may be available.

SUMMARY

The present disclosure provides some embodiments of a switching power control circuit capable of switching a plurality of control schemes by using a single IC with a relatively simple operation without increasing a size of the circuit.

In this disclosure, a "control scheme" of a switching power supply device refers to various circuit schemes used for the switching power supply device, operation modes thereof, various driving signals when driving the circuits, or combinations thereof. Circuit schemes of the switching power supply device may include a full bridge scheme, a half bridge scheme, a push pull scheme, a flyback scheme, a chopper scheme, a magnetic amp scheme, a forward scheme, and the like. Further, the forward scheme may include an active-clamp scheme and a double forward scheme. The operation modes may encompass a boosting mode, a bucking mode, a reversing mode, and the like. Also, various driving signals may include a pulse frequency modulation (PFM) signal, a pulse width modulation (PWM) signal, a phase shift signal, and the like.

According to one embodiment of the present disclosure, there is provided a switching power control circuit, including: an analog-to-digital converter (ADC) configured to convert an analog direct current (DC) voltage into a digital voltage; a digital compensator configured to set a gain and phase characteristics of the digital voltage output from the ADC and output a digital compensation value; and a pulse generating circuit configured to generate at least one driving signal based on the digital compensation value. The pulse generating circuit may be switched by an ON/OFF signal for turning on or off an output of the driving signal from the pulse generating circuit and a control scheme selection signal for selecting a predetermined driving signal from the driving signal.

The switching power control circuit may further includes a digital-to-analog converter (DAC) configured to convert the digital compensation value output from the digital compensator into an analog compensation value; and a comparator configured to compare the analog compensation value with a current flowing in a switching element. The DAC and the comparator may be connected between the digital compensator and the pulse generating circuit, and an output from the comparator may be input to the pulse generating circuit.

The analog DC voltage may include a first DC voltage and a second DC voltage. The first DC voltage may be input to a first input of a selecting circuit through a first ADC and the second DC voltage may be input to a second input of the selecting circuit through a second ADC. One of the first DC voltage and the second DC voltage may be input to the digital compensator by a switching operation of the selecting circuit.

The analog DC voltage may include a first DC voltage and a second DC voltage. The first DC voltage may be input to a first contact of a switch and the second DC voltage may be input to a second contact of the switch. One of the first DC voltage and the second DC voltage may be input to the digital compensator by a switching operation of the switch.

The digital compensator may include a proportional integral (PI) control circuit.

The pulse generating circuit may be turned off by the ON/OFF signal, the control scheme selection signal may be applied to the pulse generating circuit after the pulse generating circuit is turned off, and the pulse generating circuit may be turned on by the ON/OFF signal after the control scheme selection signal is applied to the pulse generating circuit.

The switching power control circuit may further include a first register and a second register. The gain and phase characteristics may be temporarily stored in the first register and transmitted to the digital compensator from the first register, and a frequency of the driving signal generated by the pulse generating circuit and a dead time may be temporarily stored in the second register.

The gain and phase characteristics temporarily stored in the first register and the frequency and the dead time temporarily stored in the second register may be transmitted from a microcomputer.

The switching power control circuit may further include a non-volatile memory. The gain and phase characteristics temporarily stored in the first register and the frequency and the dead time temporarily stored in the second register may be transmitted from the non-volatile memory.

The switching power control circuit may further include a data reading circuit. The data reading circuit may be installed between the non-volatile memory and the registers, the gain and phase characteristics to be set in the digital compensator and the frequency of the driving signal and the dead time to be set in the pulse generating circuit may be temporarily stored in the first register and the second register from the non-volatile memory by the data reading circuit, the gain and phase characteristics may be transmitted to the digital compensator from the first register and set in the digital compensator, and the frequency of the driving signal and the dead time may be transmitted to the pulse generating circuit from the second register and set in the pulse generating circuit.

The control scheme selection signal may be input to both of the pulse generating circuit and the data reading circuit.

The data reading circuit may include an upper address for selecting a control scheme, and the upper address may be designated to read a specified control scheme selection signal from among a plurality of candidate control scheme selection signals.

The data reading circuit may include a lower address, and the lower address may be designated to read the gain and phase characteristics to be set in the digital compensator and the frequency of the driving signal and the dead time to be set in the pulse generating circuit.

The gain and phase characteristics, the frequency of the driving signal, and the dead time may be stored in the non-volatile memory according to the control scheme.

The driving signal output from the pulse generating circuit may include at least one of a phase shift signal, a synchronization rectified signal, a PWM signal, and a PFM signal.

The phase shift signal, the synchronization rectified signal, the PWM signal, and the PFM signal may be used as the driving signal for a full bridge scheme, a half bridge scheme, an active-clamp scheme, a chopper scheme, and a push pull scheme, respectively.

The switching power control circuit may be configured to bi-directionally deliver a first DC voltage or a second DC voltage, and at least one control scheme selected from the full bridge scheme, the half bridge scheme, the active-clamp scheme, the chopper scheme, and the push pull scheme may be used for at least one of the first DC voltage and the second DC voltage.

DETAILED DESCRIPTION

As a switching power supply device, for example, a DC/DC converter is available. For example, the DC/DC converter first converts a first direct current (DC) voltage into an alternating current (AC) voltage using a switching element or a switching circuit, and then boosts (steps up) or bucks (steps down) the AC voltage using a transformer and converts the boosted or bucked voltage into a second DC voltage using a smoothing circuit. A DC/DC converter using a transformer is referred to as an isolated DC/DC converter. On the other hand, a non-isolated DC/DC converter does not use a transformer in many cases. A switching power control circuit of the present disclosure may be adaptable for an isolated DC/DC converter. In addition, the switching power control circuit may also adaptable for a non-isolated DC/DC converter.

Figure 1:
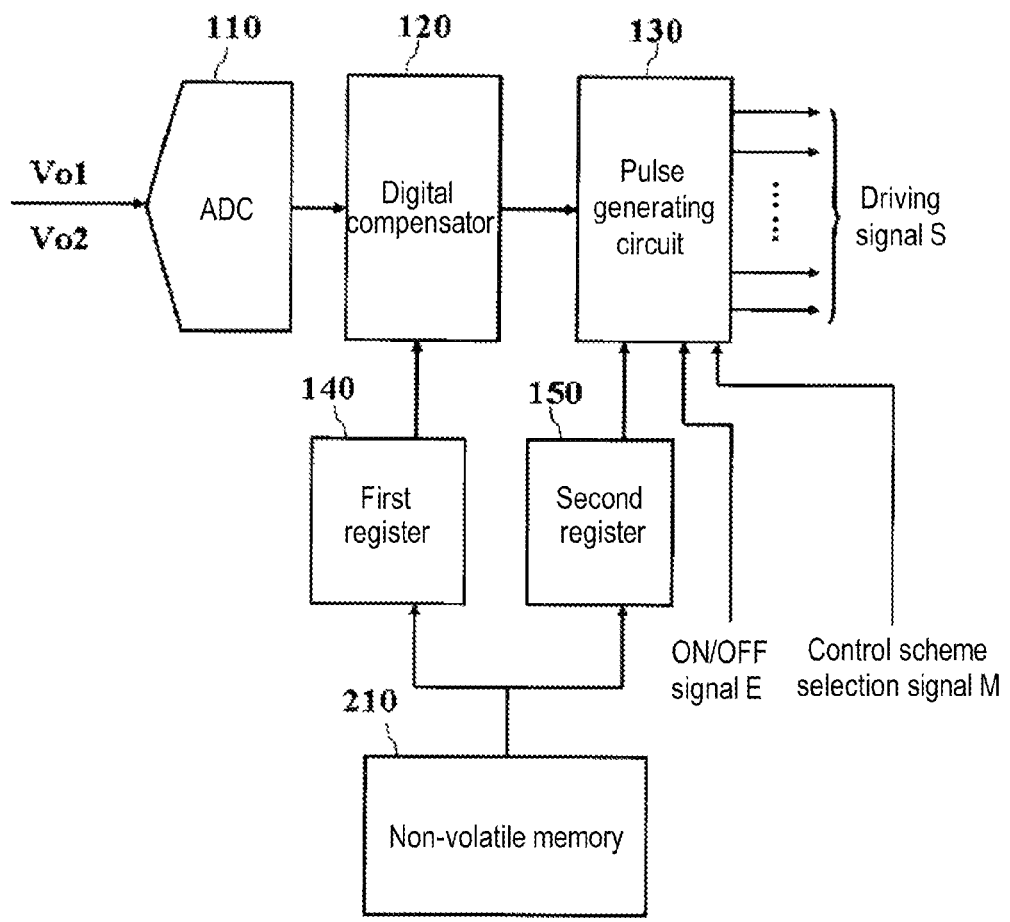
FIG. 1 is a block diagram of a switching power control circuit, according to an embodiment of the present disclosure.

FIG. 1 is a block diagram of a switching power control circuit 100, according to one embodiment of the present disclosure. The switching power control circuit 100 is configured as a single integrated circuit (IC) and used, for example, in an isolated DC/DC converter. The switching power control circuit 100 may include an analog-to-digital converter (ADC) 110, a digital compensator 120, a pulse generating circuit 130, registers 140 and 150, and a non-volatile memory 210.

The digital compensator 120 may receive a digital voltage of a digital value that has been converted by the ADC 110. Further, an error amplifier (not shown) may be interposed between the ADC 110 and the digital compensator 120. The error amplifier may compare the AD-converted digital value with a digital reference value to generate a corresponding error signal. The generated error signal is input to the digital compensator 120. The digital compensator 120 may generate a digital feedback signal based on the error signal. A first DC voltage Vo1 or a second DC voltage Vo2 is set to a predetermined value by the digital feedback signal. Further, the digital compensator 120 may set a gain and compensate a phase. Gain setting and phase compensation may be performed by compensating for attenuation of a gain and a phase delay using a smoothing circuit (not shown) to stabilize a closed loop of an overall switching power supply device including the switching power control circuit.

In order to stabilize a closed loop of the switching power supply device, gain margin and phase compensation need to be secured. The gain margin refers to a gain when a phase is delayed by 180 degrees, and the phase compensation refers to a magnitude of a margin for a phase of 180 degrees when a gain is 0 dB. For example, when the phase compensation is 70 degrees, the switching power supply device may stably supply an output voltage. In order to secure such gain margin and phase compensation, the digital compensator 120 may perform gain compensation and phase compensation. The digital compensator 120 may employ well-known proportional (P) control, proportional integral (PI) control, proportional integral differential (PID) control, or the like.

The pulse generating circuit 130 is configured to receive a signal from the digital compensator 120 to generate a driving signal S for driving, for example, a full bridge circuit or a half bridge circuit arranged in a subsequent stage. The pulse generating circuit 130 may include a flip-flop group and a logical circuit group. The pulse generating circuit 130 is also provided with an ON/OFF signal E and a control scheme selection signal M from a register group 510 to be described later. The ON/OFF signal E may be used to block a driving signal S from being output from the pulse generating circuit 130. The control scheme selection signal M may be used to select and determine a control scheme of the driving signal S to be output from the pulse generating circuit 130.

The ON/OFF signal E may be used to control the driving signal S to be output from the pulse generating circuit 130. When the ON/OFF signal E is indicative of ON, the driving signal S is output, and when the ON/OFF signal E is indicative of OFF, the driving signal S is not output.

The control scheme selection signal M is a select signal for outputting, from the pulse generating circuit 130, any one of, for example, a phase shift signal, a synchronization rectified signal, a PWM signal, and a PFM signal, or a plurality of driving signals (control signals) that are appropriate for a circuit scheme when the switching power supply device is configured to employ any one of, for example, a full bridge scheme, a half bridge scheme, an active-clamp scheme, a chopper scheme, and a push pull scheme, or based on any combinations thereof. In order to select a control signal that is appropriate for a desired control scheme, the driving signal S being output from the pulse generating circuit 130 is first turned off by using the ON/OFF signal E, and thereafter, a predetermined control scheme selection signal M is applied to the pulse generating circuit 130. When the predetermined control scheme selection signal M is applied, for example, a phase shift signal, a PWM signal, a synchronization rectified signal, a PFM signal, or the like may be output from the pulse generating circuit 130.

The first register 140 may temporarily store various parameters that are appropriate for control schemes, respectively, in the digital compensator 120. When the digital compensator 120 employs, for example, PI control, multipliers 121 and 122 (see FIG. 4 described later) are provided in the digital compensator 120 and these multipliers may be given well-known proportional factor and integral constant. Various parameters as mentioned herein represent these various set values. A gain and phase characteristics of the digital compensator 120 are determined by PI control.

The second register 150 may temporarily store various parameters that are appropriate for control schemes, respectively, in the pulse generating circuit 130. Here, the second register 150 temporarily stores various parameters, a frequency of the driving signal S being output from the pulse generating circuit 130, and a dead time. For example, a frequency of a phase shift signal, a PWM signal, a synchronization rectified signal, and a PFM signal, a dead time, and the like, for example, which are appropriate for the full bridge scheme, the half bridge scheme, the active-clamp scheme, the chopper scheme, and the push pull scheme are stored in the second register 150.

The non-volatile memory 210 may store set values of various parameters, in which, for example, a gain, phase characteristics, a frequency, a dead time, and the like are set, in order to set control schemes of the digital compensator 120 and the pulse generating circuit 130. For example, an EEPROM, a flash memory, or the like may be used in the non-volatile memory 210. Various parameters stored in the non-volatile memory 210 are set in the digital compensator 120 and the pulse generating circuit 130 through the first register 140 and the second register 150.

Figure 2:
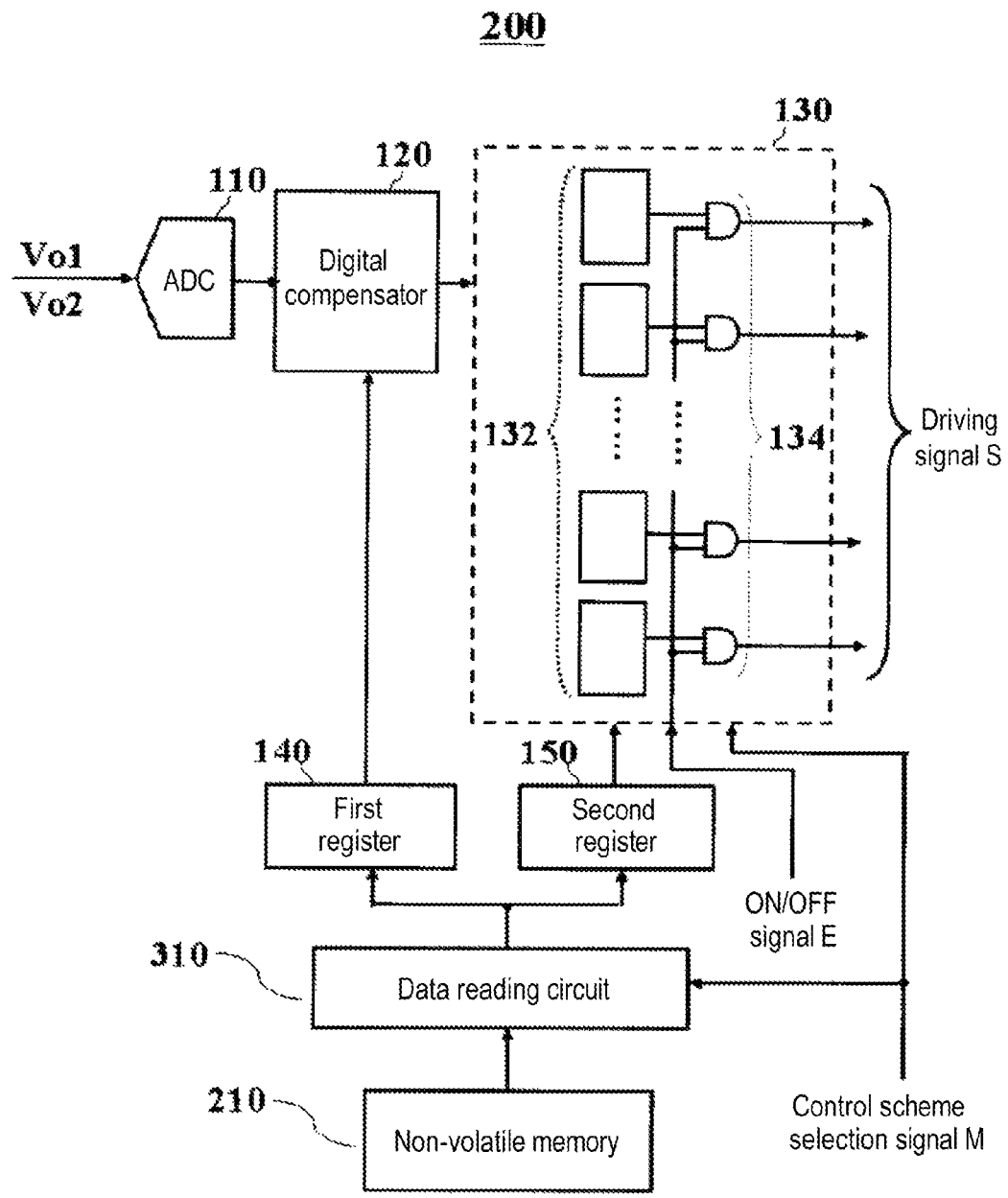
FIG. 2 is a block diagram illustrating a first modified embodiment of FIG. 1.

FIG. 2 is a block diagram of a switching power control circuit 200, according to a modification of the embodiment shown in FIG. 1. Similar to the switching power control circuit 100 in FIG. 1, the switching power control circuit 200 in FIG. 2 is configured as a single IC. The switching power control circuit 200 shown in FIG. 2 is different from the switching power control circuit 100 shown in FIG. 1 in that the pulse generating circuit 130 is illustrated in more detail. In addition, in FIG. 2, a data reading circuit 310 is installed between the first register 140 and the second register 150, and the non-volatile memory 210.

The pulse generating circuit 130 includes a flip-flop group 132 including a plurality of flip-flops and a logical circuit group 134 including a plurality of logical circuits (e.g., AND gates). Since a single logical circuit is installed to correspond to a single flip-flop, and the flip-flop group 132 and the logical circuit group 134 may have the same stage or tier number. The stage number is determined depending on the number of driving signals S. Further, the number of the driving signals S varies depending on a control scheme of the present disclosure. For example, when used for controlling the two-way full bridge type switching power control, six to eight driving signals S may be used. In this case, the stage numbers of the flip-flop group 132 and the logical circuit group 134 are provided as six to eight stages.

When the ON/OFF signal E is set to have a high level, the logical circuit group 134 may be turned on and a signal input from the flip-flop group 132 to the logical circuit group 134 may be output as the driving signal S. Meanwhile, when the ON/OFF signal E is set to have a low level, the logical circuit group 134 may be turned off and the driving signal S being output may be blocked.

The data reading circuit 310 may transmit or deliver to the first register 140 and the second register 150 various parameters which are stored in the non-volatile memory 210 and set in the digital compensator 120 and the pulse generating circuit 130. The control scheme selection signal M applied to the pulse generating circuit 130 may be simultaneously applied to the data reading circuit 310.

Figure 3:
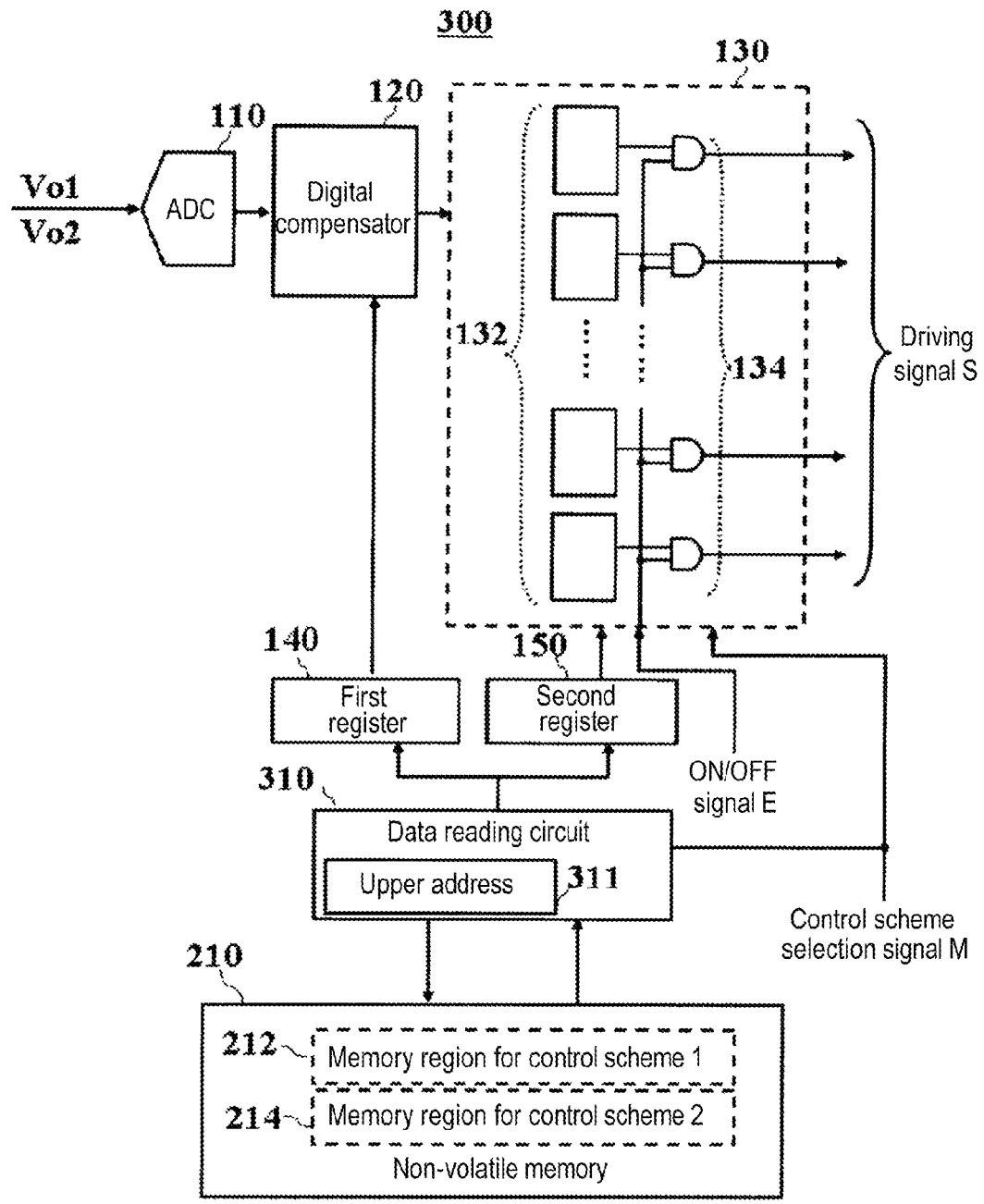
FIG. 3 is a block diagram illustrating a modified embodiment of FIG. 2.

FIG. 3 is a block diagram of a switching power control circuit 300, according to a modification of the embodiment illustrated in FIG. 2. The switching power control circuit 300 shown in FIG. 3 is configured as a single IC similar to those shown in FIGS. 1 and 2. The switching power control circuit 300 is different from the switching power control circuit 200 in that an upper address 311 is provided in the data reading circuit 310. With such a configuration, a plurality of control schemes stored in the non-volatile memory 210 may be selected by the data reading circuit 310. In addition, the switching power control circuit 300 is different from the switching power control circuit 200 in that a memory region 212 for a control scheme 1 and a memory region 214 for a control scheme 2, for example, are included in the non-volatile memory 210. The provision of the memory regions separately for their respective control schemes may be attributed to the provision of the upper address 311 in the data reading circuit 310. By designating the upper address 311, a desired control scheme may be set. Also, while two control schemes are illustrated in the non-volatile memory 210, the present disclosure is not limited thereto but three or more control schemes may be prepared in advance.

Figure 4:
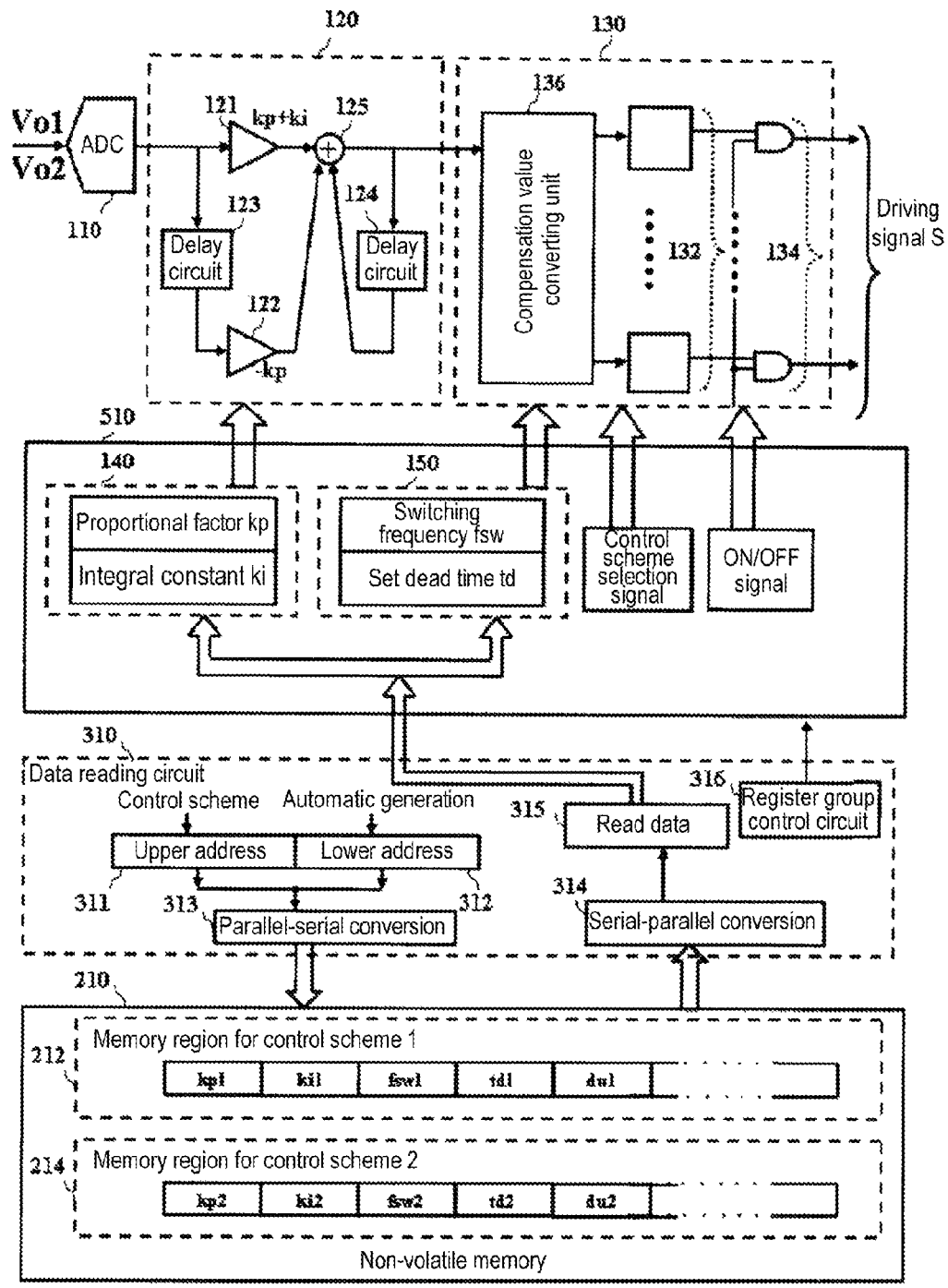
FIG. 4 is a block diagram illustrating a specified embodiment of FIG. 3.

FIG. 4 is a specified diagram of a switching power control circuit 400, according to a modification of the embodiment shown in FIG. 3. The switching power control circuit 400 is configured as a single IC. Here, differences of the switching power control circuit 400 from the switching power control circuit 300 of FIG. 3 will be described.

The digital compensator 120 includes a PI control circuit which may be known in digital signal processing. The PI control circuit includes multipliers 121 and 122, delay circuits 123 and 124, and an adder 125. An output from the digital compensator 120 is a digital signal and a gain and phase characteristics are set as, for example, a proportional factor, an integral constant, and the like given to the multipliers 121 and 123. An output from the digital compensator 120 is input to a compensation value converting unit 136 constituting the pulse generating circuit 130 in the subsequent stage.

The pulse generating circuit 130 includes the compensation value converting unit 136, the flip-flop group 132, and the logical circuit group 134. The compensation value converting unit 136 generates, for example, a PWM signal and a phase shift signal depending on a digital compensation value output from the digital compensator 120. That is, the compensation value converting unit 136 converts a digitalized signal into a driving signal S having a time-varying waveform. With such a configuration, a duty ratio, a pulse width, a frequency, and the like of the driving signal S are set.

A register group 510 includes the first register 140 and the second register 150. In addition, the register group 510 includes one or more units for outputting an ON/OFF signal E for turning on and off the pulse generating circuit 130, and a control scheme selection signal M. For example, the first register 140 stores a proportional factor kp and an integral constant ki of the multipliers 121 and 122 for setting various parameters of the digital compensator 120. Such factor and constant may determine a gain and phase characteristics of the digital compensator 120.

The second register 150 temporarily stores various parameters such as, for example, a switching frequency fsw and a dead time td of the compensation value converting unit 136 constituting the pulse generating circuit 130.

The flip-flop group 132 and the logical circuit group 134 output a driving signal S having a gain, phase characteristics, a switching frequency, a duty, a pulse width, and the like, set in the digital compensator 120 and the compensation value converting unit 136.

The data reading circuit 310 includes the upper address 311, a lower address 312, a parallel-serial converting unit 313, a serial-parallel converting unit 314, a read data 315, and a register group control circuit 316.

The upper address 311 is configured as, for example, a 3-bit digital signal, and is assigned an identification number for each control scheme, for example, a circuit scheme such as a full bridge scheme, a half bridge scheme, an active-clamp scheme, a chopper scheme, or a push pull scheme.

The lower address 312 is configured as, for example, a 8-bit digital signal and designates where the information such as the proportional factor kp and the integral constant ki, the switching frequency fsw, and the dead time td is located in the memory region 212 for the control scheme 1 or the memory region 214 for the second control scheme. The lower address 312 may be increased so as to be automatically generated in the data reading circuit 310.

The parallel-serial converting unit 313 is configured to convert parallel data into serial data in designating an address in the non-volatile memory 210 from the upper address 311 and the lower address 312. The parallel-serial converting unit 313 may be available in the case in which a serial interface such as an inter-integrated circuit (IIC) or a serial peripheral interface (SPI) is used as an interface with the non-volatile memory 210. On the other hand, if the non-volatile memory 210 has a parallel interface, the parallel-serial converting unit 313 may be omitted.

The serial-parallel converting unit 314 is configured to convert serial data into parallel data in transmitting various parameters to the first register 140 and the second register 150 constituting the register group 510 from the non-volatile memory 210. The serial-parallel converting unit 314 may be available in the case in which a serial interface such as an IIC or an SPI is used as an interface with the non-volatile memory 210. On the other hand, if the non-volatile memory 210 has a parallel interface, the serial-parallel converting unit 314 is also not necessary.

Set values for the control scheme 1 and set values for the control scheme 2 are stored in the memory region 212 for the control scheme 1 and the memory region 214 for the control scheme 2 of the non-volatile memory 210, respectively. In the non-volatile memory 210, various parameters used for the respective control schemes, i.e., various data set values are batched and stored in accordance with the control schemes, rather than being randomly stored. With such a data storage method, when a certain control scheme selection signal M is selected, the corresponding control scheme may be promptly determined.

As the set values for the control scheme 1, for example, a proportional factor kp1, an integral constant ki1, a switching frequency fsw1, a dead time td1, and the like of a multiplier used for a PI control circuit are stored. In addition, a pulse width of the driving signal S, or the like may also be the set value for the control scheme 1. In the case of using a two-way isolated full bridge circuit in the switching power control circuit, a primary side of a transformer may supply an input voltage, and an output voltage may be extracted from a secondary side thereof in accordance with the control scheme 1. In such a case, an input voltage may be supplied from the secondary side of the transformer and an output voltage may be extracted from the primary side thereof in accordance with the control scheme 2. A relationship between the input voltage and the output voltage may be bucking or boosting. Details thereof will be described later.

The set values for the control scheme 2 may be identical or similar to those for the control scheme 1. For example, a proportional factor kp2, an integral constant ki2, a switching frequency fsw2, a dead time td2, and the like of a multiplier used for a PI control circuit are stored. In addition, a pulse width of the driving signal S, or the like may also be the set value for the control scheme 2. In the case of using a two-way isolated full bridge circuit in the switching power control circuit, an input voltage may be supplied from the secondary side of the transformer and an output voltage may be extracted in the primary side thereof in accordance with the control scheme 2. A relationship between the input voltage and the output voltage may also be bucking or boosting. Details thereof will be described later.

Figure 5:
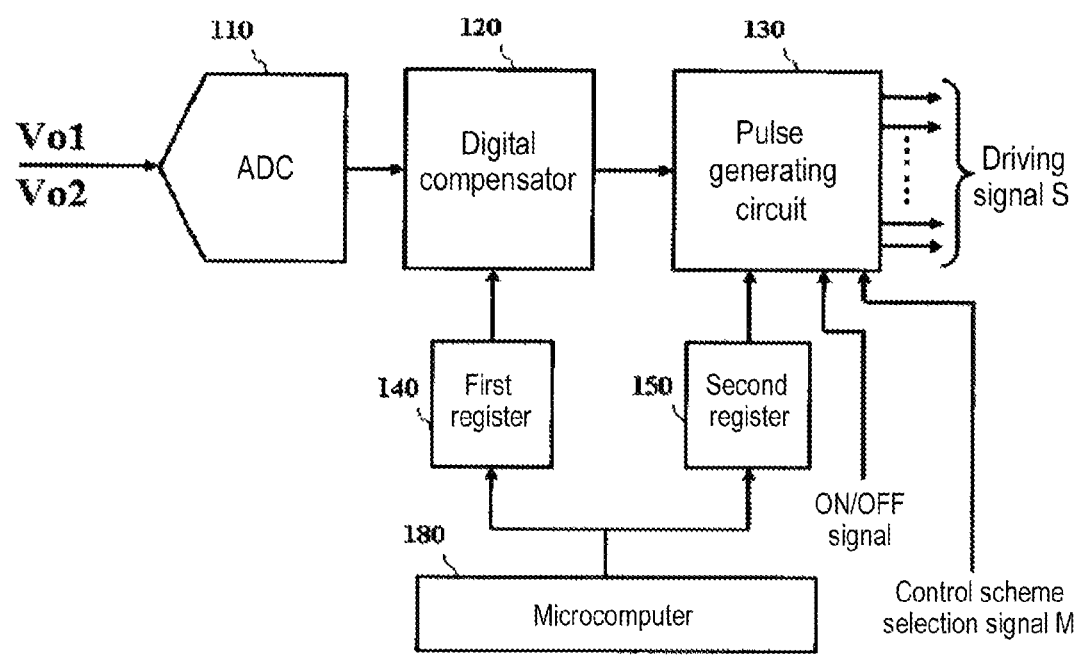
FIG. 5 is a block diagram illustrating a second modified embodiment of FIG. 1.

FIG. 5 is a block diagram of a switching power control circuit 500, according to a modification of the embodiment shown in FIG. 1. The switching power control circuit 500 is different from the switching power control circuit 100 in that a microcomputer 180 is used. That is, in FIG. 1, the non-volatile memory 210 is used, while, in FIG. 5, the microcomputer 180 is used in the switching power control circuit 500 in place of the non-volatile memory 210. When the microcomputer 180 is used, a further specified management (or operation), such as monitoring a first DC voltage Vo1 and a second DC voltage Vo2, may be performed. As an interface of the microcomputer 180, for example, an IIC, an SPI, a power management bus (PMBus), or a system management bus (SMBus) may be used.

Figure 6A:
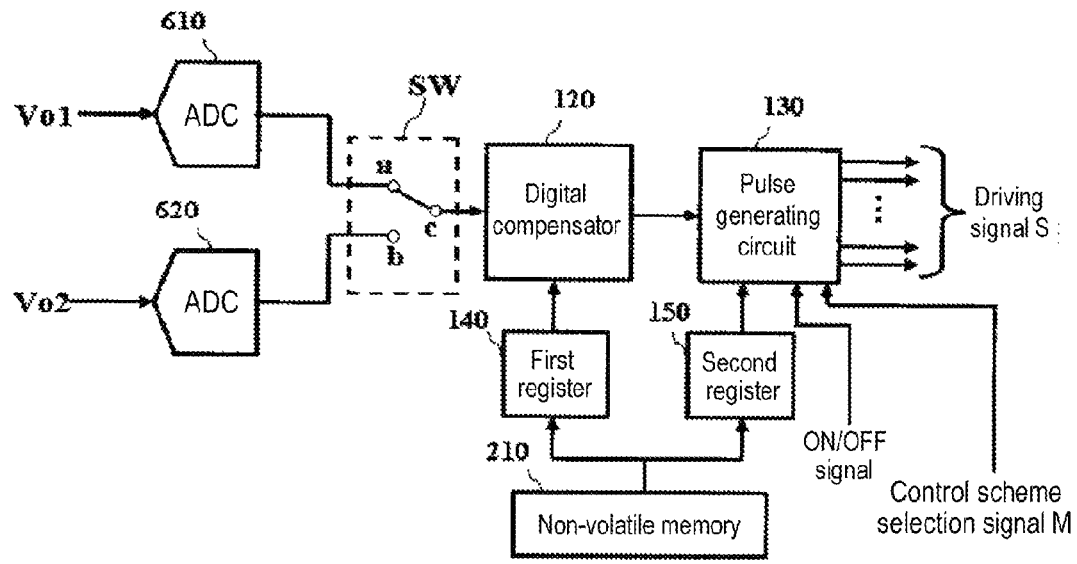
FIG. 6A is a block diagram illustrating switching of an ADC illustrated in FIG. 1.

FIG. 6A is a view illustrating switching of an ADC. As shown, a switching power control circuit 600A includes ADCs 610 and 620, and a selecting circuit SW. Other components may be identical to those illustrated in FIG. 1. A first DC voltage Vo1 is an analog value. When the analog DC voltage Vo1 is input to the ADC 610, data converted into a digital value, as an output from the ADC 610, is transmitted or delivered to a first input a of the selecting circuit SW.

Similar to the first DC voltage Vo1, a second DC voltage Vo2 is an analog value. When the analog DC voltage Vo2 is input to the ADC 620, data converted into a digital value, as an output from the ADC 620, is transmitted to a second input b of the selecting circuit SW.

An intermediate point c of the selecting circuit SW is coupled to the digital compensator 120, and when the intermediate point c selects the first input a, the first DC voltage Vo1 is processed in the digital compensator 120 and the pulse generating circuit 130. In this case, the second DC voltage Vo2 is not processed in the digital compensator 120 and the pulse generating circuit 130. Thus, a magnitude, a gain, and phase characteristics of the second DC voltage Vo2 are not controlled.

On the other hand, when the intermediate point c of the selecting circuit SW selects the second input b, the second DC voltage Vo2 is controlled while the first DC voltage Vo1 is not controlled.

Whether the intermediate point c of the selecting circuit SW is to select the first input a or the second input b is determined depending on whether which one is set to an input voltage. For example, in the case where the first DC voltage Vo1 is set to an input voltage and the second DC voltage Vo2 is extracted as an output voltage based on the first DC voltage Vo1, the intermediate point c of the selecting circuit SW selects the first input a. In the opposite case, the intermediate point c selects the second input b. In any cases, the selecting circuit SW may be available in order to minimize the number of stages of the digital compensator 120 and the pulse generating circuit 130.

In the switching power control circuit 600A, even while an output voltage is being controlled depending on any one of the first DC voltage Vo1 and the second DC voltage Vo2, the ADC 610 and the ADC 620 may constantly monitor the other output voltage and use it for a different purpose.

Figure 6B:
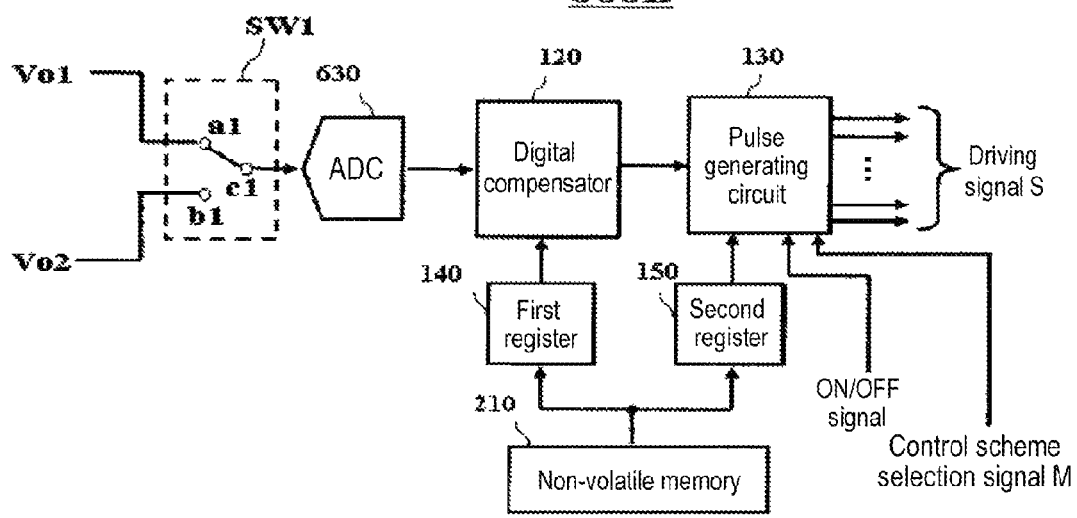
FIG. 6B is a block diagram illustrating a modified embodiment of FIG. 6A.

A switching power control circuit 600B illustrated in FIG. 6B includes an ADC 630 and a switch SW1. The switching power control circuit 600B of FIG. 6A is different from the switching power control circuit 600A of FIG. 6A in that the single ADC 630 is formed. That is, in FIG. 6A, two ADCs are provided, while the switching power control circuit 600B illustrated in FIG. 6B includes only the single ADC 630. A first DC voltage Vo1 is transmitted to a contact a1 of the switch SW1 and a second DC voltage Vo2 is transmitted to a contact b1. An intermediate point c1 of the switch SW1 is coupled to an input of the ADC 630. A switching operation of the switch SW1 is performed in the same or similar manner as that of FIG. 6A. The switching power control circuit 600B may include only the single ADC 630. Other components thereof may be identical to those of FIG. 1.

The first DC voltage Vo1 and the second DC voltage Vo2 may have analog values. The first DC voltage Vo1 or the second DC voltage Vo2 of an analog valve is input to the contact a1 or the contact b1 and transmitted to the intermediate point c1 of the switch SW1.

The intermediate point c1 of the switch SW1 is coupled to the digital compensator 120 through the ADC 630. When the intermediate point c1 selects the contact a1, the first DC voltage Vo1 is processed by the digital compensator 120 and the pulse generating circuit 130. In such a case, the second DC voltage Vo2 is not processed by the digital compensator 120 and the pulse generating circuit 130. Thus, a magnitude, a gain, and phase characteristics of the second DC voltage Vo2 are not controlled.

Meanwhile, when the intermediate point c1 of the switch SW1 selects the contact b1, the second DC voltage Vo2 is controlled while the first DC voltage Vo1 is not controlled.

Whether the intermediate point c1 of the switch SW1 is to select the contact a1 or the contact b1 is determined depending on whether which voltage is set to an input voltage. For example, in the case where the first DC voltage Vo1 is set to an input voltage and the second DC voltage Vo2 is extracted as an output voltage based the first DC voltage Vo1, the intermediate point c1 of the switch SW1 selects the contact a1. In the opposite case, the intermediate point c1 selects the contact b1. In any cases, since the ADC 630 is shared by the first DC voltage Vo1 and the second DC voltage Vo2, a dynamic range and responsiveness of the ADC 630 may be taken into consideration.

Figure 7:
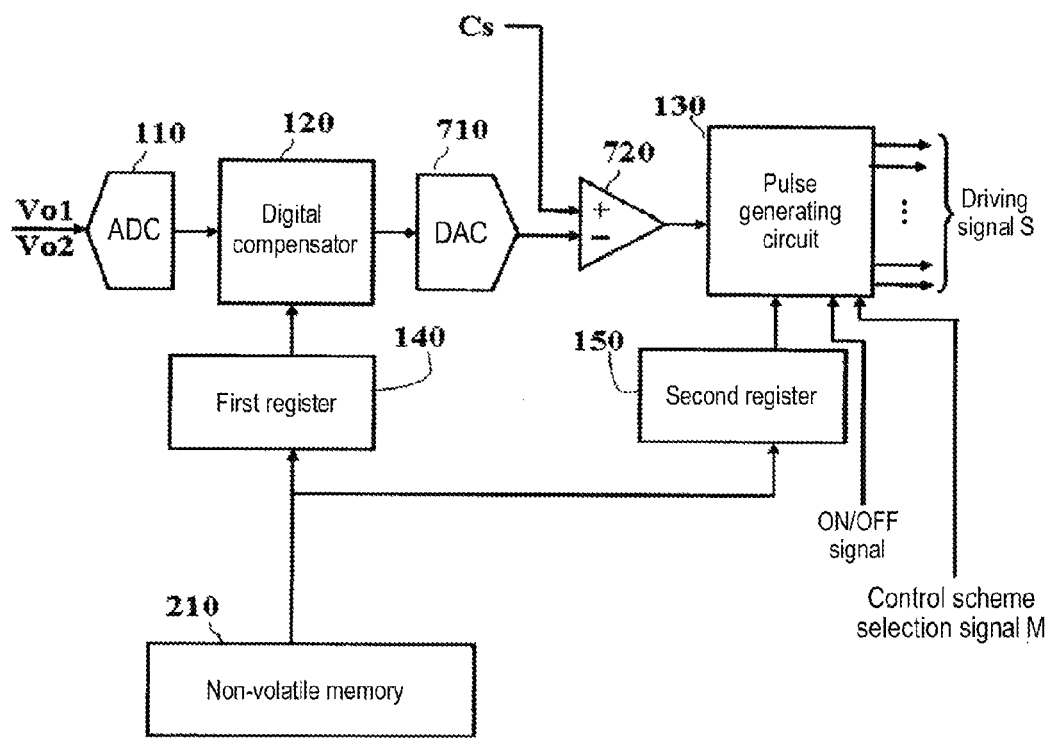
FIG. 7 is a block diagram illustrating a current mode-type switching power supply circuit used as a switching power control circuit, according to an embodiment of the present disclosure.

FIG. 7 illustrates a diagram of a current mode-type switching power control circuit 700 used as a switching power control circuit, according to one embodiment of the present disclosure. The switching power control circuit 700 is different from the switching power control circuit of FIG. 1, in that a DAC 710 and a comparator 720 are added. In order to convert a digital signal of a digital value output from the digital compensator 120 into an analog signal of an analog value, the DAC 710 is provided and a converted analog voltage is applied to an inverting input terminal of the comparator 720. Further, a current flowing in a switching element configured to generate the first DC voltage Vo1 or the second DC voltage Vo2 is detected by a current transformer Cs and the current is converted into a voltage and applied to a non-inverting input terminal of the comparator 720.

In the current mode-type switching power control circuit 700 illustrated in FIG. 7, the pulse generating circuit 130 is turned on or off by the ON/OFF signal E. Further, by inputting the control scheme selection signal M, the effect identical or similar to that of the voltage-mode type switching power control circuit illustrated in FIGS. 1 to 6 may be obtained.

Figure 8:
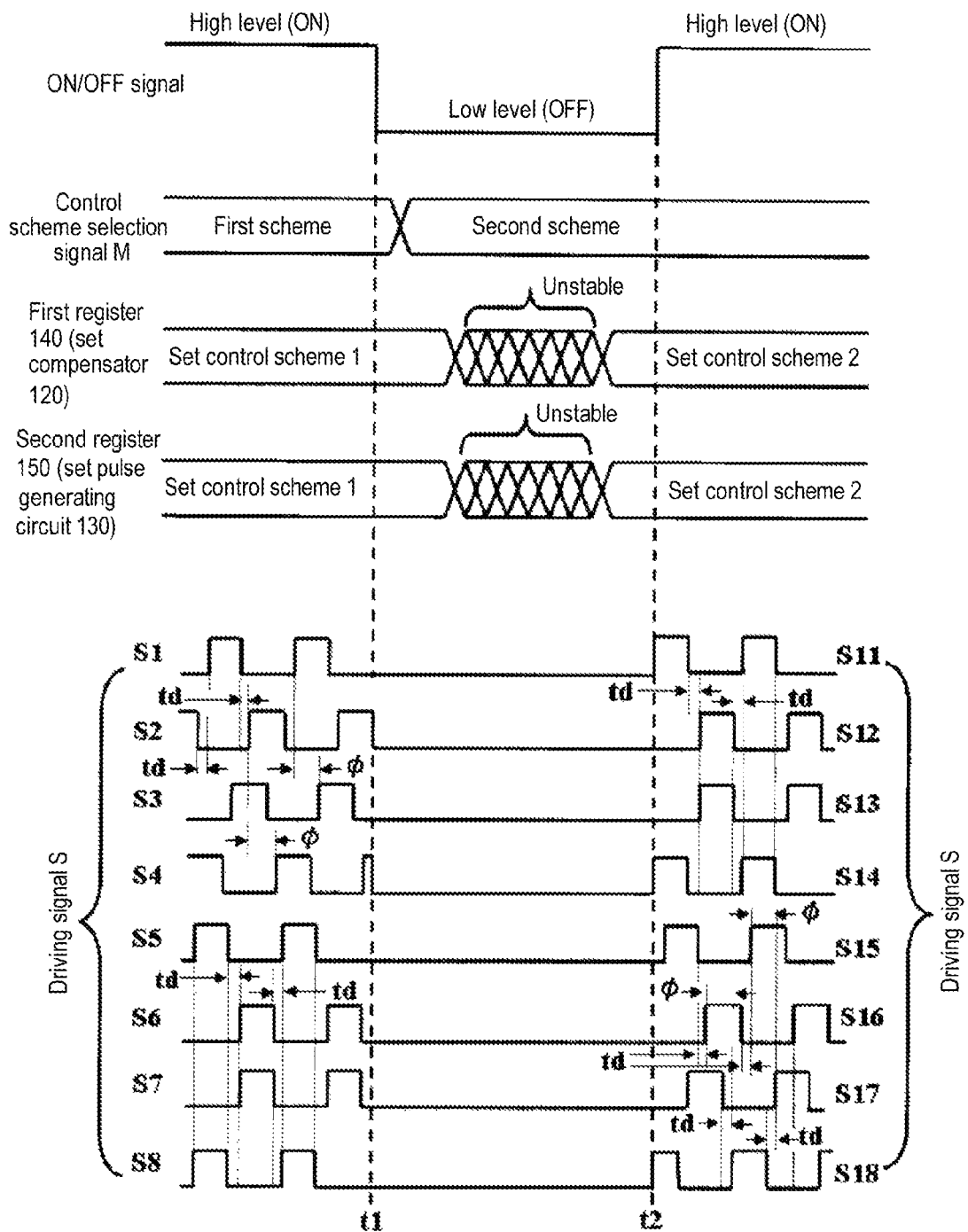
FIG. 8 is a timing chart illustrating switching of a control scheme in the switching power control circuit, according to an embodiment of the present disclosure.

FIG. 8 is a timing chart illustrating a switching state of the pulse generating circuit 130. As described above, the pulse generating circuit 130 may operate in two control schemes by receiving the ON/OFF signal E and the control scheme selection signal M. This will be described with reference to FIG. 4 hereinafter.

In FIG. 8, the ON/OFF signal E is applied from the register group 510 to the pulse generating circuit 130, and it is determined whether to output the driving signal S from the pulse generating circuit 130. When the ON/OFF signal E is indicative of a high level, the driving signal S is output. On the other hand, when the ON/OFF signal is indicative of a low level, the driving signal S being output is blocked. The ON/OFF signal E is specifically applied to the logical circuit group 134 constituting a part of the pulse generating circuit 130. When the ON/OFF signal E is switched from a high level to a low level, a control scheme of the switching power control circuit 400 may be switched. In a conventional switching power control circuit, a control scheme is switched by a program using a DSP. However, in the present disclosure, a control scheme is switched by blocking a partial operation of the pulse generating circuit 130, without employing a DSP, which facilitates the operation since programming may not be necessary.

The control scheme selection signal M is a signal for determining and selecting a combination of a circuit scheme such as, for example, a full bridge scheme, a half bridge scheme, an active-clamp scheme, a chopper scheme, or a push pull scheme, an operational mode such as a bucking operational mode, a boosting operational mode, or an inverting operational mode, and a driving signal (control signal) such as a phase shift signal, a PWM signal, or a PFM signal.

For example, a control scheme of "phase-shift full-bridge bucking" may refer to a buck-type switching power control circuit using a phase shift signal as a driving signal (control signal) in a full bridge scheme. Likewise, a control scheme of "phase-shift full-bridge boosting" may refer to a boost-type switching power control circuit using a phase shift signal as a driving signal (control signal) in a full bridge scheme.

Similar to the ON/OFF signal E, the control scheme selection signal M is applied from the register group 510 to the pulse generating circuit 130. Also, the control scheme selection signal M is linked to the upper address 311 provided in the data reading circuit 310, and thus, when the upper address 311 is designated as a predetermined address, the control scheme selection signal M may cause switching and selecting a predetermined control scheme. For example, the control scheme may be switched from the control scheme 1 to the control scheme 2. The control scheme 1 may be set to, for example, "phase-shift full-bridge bucking" and the control scheme 2 may be set to, for example, "phase-shift full-bridge boosting". When the control scheme 1 or the control scheme 2 is selected, the driving signal S corresponding to the selected control scheme is output from the pulse generating circuit 130.

FIG. 8 schematically illustrates a switching state in which the control scheme 1 is switched to the control scheme 2, according to one example. When the control scheme 1 is switched to the control scheme 2, the ON/OFF signal E is first adjusted to have a low level at a time t1 to block the driving signal S from being output from the pulse generating circuit 130, and then, the control scheme selection signal M for selecting the control scheme 2 is applied to the pulse generating circuit 130. Thereafter, when the ON/OFF signal E is adjusted to have a high level again to turn on the pulse generating circuit 130, the control scheme 1 is completely switched to the control scheme 2.

Various parameters such as a proportional factor kp, and an integral constant ki for setting a gain and phase characteristics of the digital compensator 120 are temporarily stored in the first register 140. When the control scheme 1 is switched to the control scheme 2, a proportional factor kp1 and an integral constant ki stored in the first register 140 are switched to a proportional factor kp2 and an integral constant ki2. Such a switching operation is performed after the control scheme selection signal M is changed. Immediately after various new parameters stored in the first register 140 are changed, various parameters of the control scheme 2 are not determined, i.e., such parameters may be in an unstable state. However, after a time t2 at which the control scheme 1 is completely switched to the control scheme 2, eliminating the unstable state, the ON/OFF signal E is switched from OFF to ON.

Various parameters for setting a switching frequency, a dead time, and the like of the pulse generating circuit 130 are temporarily stored in the second register 150. When the control scheme 1 is switched to the control scheme 2, various parameters such as, for example, a switching frequency fsw1, and a dead time td1 stored in the first register 140 are switched to a switching frequency fsw2, a dead time td2, and the like for the control scheme 2. The switching operation therebetween is performed after the control scheme selection signal M is changed. Immediately after the switching, various parameters are not determined, i.e., such parameters may be in an unstable state. However, after a time t2 at which the ON/OFF signal E is switched from OFF to ON, the control scheme 1 is completely switched to the control scheme 2.

As illustrated in FIG. 8, driving signals S1 to S8 may be output from the pulse generating circuit 130 when the control scheme 1 is selected. For example, the control scheme 1 may be selected as, for example, "phase-shift full-bridge bucking" and the control scheme 2 may be selected as, for example, "phase-shift full-bridge boosting".

Among the driving signals S1 to S8, a phase shift signal is generated depending on the driving signals S1 to S4. A phase difference φ is set between the driving signal S1 and the driving signal S3. Further, a phase difference φ having the same magnitude is set between the driving signal S2 and the driving signal S4. By allowing the driving signals S1 and S3 and the driving signals S2 and S4 to have the phase difference φ, a phase shift signal is generated. A dead time td is set between the driving signal S1 and the driving signal S2. Similarly, a dead time td (not shown) is also set between the driving signal S3 and the driving signal S4.

The driving signals S5 to S8 may be indicative of synchronization rectified signals. The driving signal S5 and the driving signal S8 are identical, and the driving signal S6 and the driving signal S7 are identical. A dead time td is set between the driving signal S5 and the driving signal S6. For example, the dead time td is set such that two transistors are not simultaneously turned on when the driving signal S5 and the driving signal S6 are employed in a synchronization rectifying switching power supply device using the two transistors.

Driving signals S11 to S18 are output from the pulse generating circuit 130 when the control scheme 2 is selected. The driving signals S11 to S14 may be indicative of synchronization rectified signals. The driving signal S11 and the driving signal S14 are identical, and the driving signal S12 and the driving signal S13 are identical. A dead time td is set between the driving signal S13 and the driving signal S14.

A phase shift signal is generated depending on the driving signals S15 to S18. A phase difference φ is set between the driving signal S15 and the driving signal S17. Further, a phase different φ having the same magnitude is also set between the driving signal S16 and the driving signal S18. By adjusting pulse widths and phase differences φ of the driving signals S15 to S18, a magnitude of a pulse voltage generated by a transformer (not shown) is set. A dead time td is set between the driving signal S15 and the driving signal S16. Similarly, the dead time td is set between the driving signal S17 and the driving signal S18.

Figure 9:
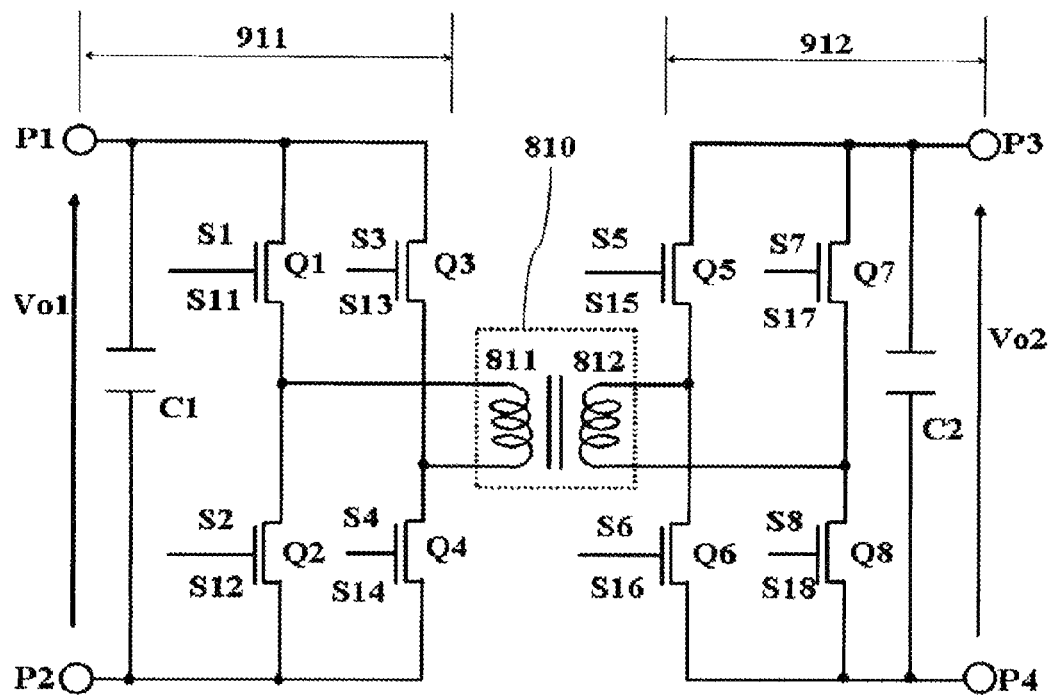
FIG. 9 is a circuit diagram of a two-way full bridge-type switching power control circuit, as a control scheme, according to an embodiment of the present disclosure.

FIG. 9 schematically illustrates a full bridge type switching power control circuit. The full bridge type switching power control circuit may be used in high-power switching power supplies. The full bridge type switching power control circuit may be used as one of control schemes according to the present disclosure. A full bridge two-way switching power supply 910 includes a first full bridge circuit 911 and a second full bridge circuit 912. The full bridge two-way switching power supply 910 constitutes a so-called two-way switching power supply device in which a voltage may be delivered from the first full bridge circuit 911 to the second full bridge circuit 912 and a voltage may also be delivered from the second full bridge circuit 912 to the first full bridge circuit 911. A first DC voltage Vo1 may be stepped down or stepped up so as to be extracted as the first DC voltage Vo1. Also, the first DC voltage Vo1 and the second DC voltage Vo2 are, for example, 100 V and 12 V, respectively.

The first full bridge circuit 911 is coupled to a primary winding 811 of a transformer 810, and the second full bridge circuit 912 is coupled to a secondary winding 812 thereof.

The first full bridge circuit 911 includes terminals P1 and P2, a capacitor C1, and transistors Q1 to Q4. The transistor Q1 and the transistor Q2 are connected in series, the transistor Q3 and the transistor Q4 are also connected in series, and their respective series connection bodies are connected between the terminal P1 and the terminal P2. The first DC voltage Vo1 is input and output between the terminal P1 and the terminal P2.

The second full bridge circuit 912 has a circuit configuration identical to that of the first full bridge circuit 911. The second full bridge circuit 912 includes terminals P3 and P4, a capacitor C2, and transistors Q5 to Q8.

In a case in which a DC voltage is delivered from the first full bridge circuit 911 to the second full bridge circuit 912, that is, in a case in which the first DC voltage Vo1 is an input voltage and the second DC voltage Vo2 is extracted as an output voltage, the driving signals S1 to S4 as illustrated in FIG. 8 are separately applied to gates of the transistors Q1 to Q4 constituting the first full bridge circuit 911. The driving signals S1 to S4 are, for example, phase shift signals. Also, the driving signals S5 to S8 illustrated in FIG. 8 are separately applied to gates of the transistors Q5 to Q8 constituting the second full bridge circuit 912. The driving signals S5 to S8 are synchronization rectified signals as mentioned above.

In a case in which the first full bridge circuit 911 is set to an input side and the second full bridge circuit 912 is set to an output side, the driving signals S5 to S8 are set such that the first full bridge circuit 911 converts the first DC voltage Vo1 into an AC voltage (pulse voltage) and the second full bridge circuit 912 operates with a rectifying circuit that converts the generated pulse voltage into a DC. The capacitor C2 is used as a smoothing circuit for smoothing an AC voltage.

In a case in which a DC voltage is delivered from the second full bridge circuit 912 to the first full bridge circuit 911, that is, in a case in which the second DC voltage Vo2 is an input voltage and the first DC voltage Vo1 is extracted as an output voltage, the driving signals S11 to S14 as illustrated in FIG. 8 are separately applied to gates of the transistors Q1 to Q4 constituting the first full bridge circuit 911. The driving signals S11 to S14 are synchronization rectified signals as mentioned above. At this time, the driving signals S15 to S18 illustrated in FIG. 8 are separately applied to gates of the transistors Q5 to Q8 constituting the second full bridge circuit 912. The driving signals S15 to S18 are phase shift signals as mentioned above. When the second full bridge circuit 912 is set to an input side and the first full bridge circuit 911 is set to an output side, the driving signals S11 to S14 are set such that the first full bridge circuit 911 operates as a rectifying circuit. The capacitor C1 is used as a smoothing circuit that converts a pulse voltage into a DC voltage.

So-called body diodes (not shown) are interposed between drains and sources of the transistors Q1 to Q8 illustrated in FIG. 9. The body diodes are used as diodes constituting a conventional rectifying circuit. With this configuration, a driving signal selected from among the driving signals S1 to S8 and the driving signals S11 to S18 may be simply set to a low level signal or a high level signal, rather than to a phase shift signal, a synchronization rectified signal, a PWM signal, or a PFM signal.

Figure 10:
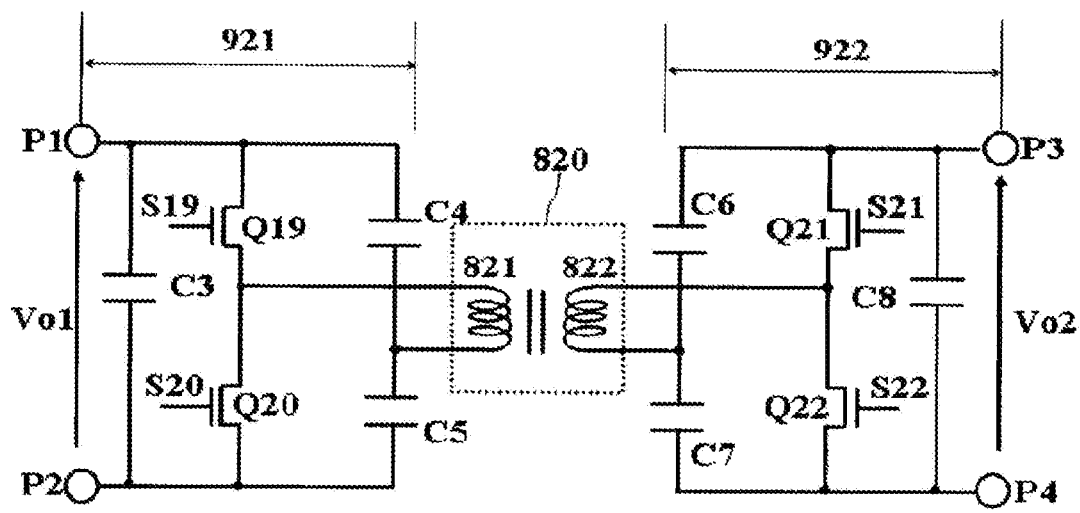
FIG. 10 is a view illustrating a half bridge-type switching power control circuit as a control scheme, according to an embodiment of the present disclosure.

FIG. 10 schematically illustrates a half bridge-type switching power control circuit. The half bridge type switching power control circuit may be basically configured as half of the transistors in the full bridge type switching power control circuit. A half bridge two-way switching power supply 920 as a target of a control scheme according to the present disclosure includes a first half bridge circuit 921 and a second half bridge circuit 922. The half bridge two-way switching power supply 920 constitutes a so-called two-way switching power supply device in which a voltage may be delivered from the first half bridge circuit 921 to the second half bridge circuit 922 and a voltage may also be delivered from the second half bridge circuit 922 to the first half bridge circuit 921. That is, a first DC voltage Vo1 may be stepped down or stepped up so as to be extracted as a second DC voltage Vo2. Also, the second DC voltage Vo2 may be stepped down or stepped up so as to be extracted as the first DC voltage Vo1.

The first half bridge circuit 921 is coupled to a primary winding 821 side of a transformer 820, and the second half bridge circuit 922 is coupled to a secondary winding 822 side thereof.

The first half bridge circuit 921 includes terminals P1 and P2, capacitors C3 to C5, and transistors Q19 and Q20. The transistor Q19 and the transistor Q20 are connected in series, the capacitor C4 and the capacitor C5 are connected in series, and their respective series connection bodies are connected between the terminal P1 and the terminal P2. The first DC voltage Vo1 having an analog value is input and output between the terminal P1 and the terminal P2.

A primary winding 821 is coupled to a common node between the transistor Q19 and the transistor Q20 and a common node between the capacitor C4 and the capacitor C5.

When the first half bridge circuit 921 is configured in a smoothing circuit, i.e., in an output side, the capacitor C3 smoothes a pulse voltage (AC voltage) to a DC, and when the first half bridge circuit 921 is configured in an input side, the capacitor C3 serves to remove a ripple component of the first DC voltage Vo1.

The second half bridge circuit 922 includes terminals P3 and P4, capacitors C6 to C8, and transistors Q21 and Q22. The transistor Q21 and the transistor Q22 are connected in series and the capacitor C6 and the capacitor C7 are connected in series, and their respective series connection bodies are coupled between the terminal P3 and the terminal P4. A second DC voltage Vo2 having an analog value is input and output between the terminal P3 and the terminal P4.

A secondary winding 822 is coupled between a common node between the transistor Q21 and the transistor Q22 and a common node between the capacitor C6 and the capacitor C7.

When the second half bridge circuit 922 is configured in a smoothing circuit, i.e., in an output side, a capacitor C8 smoothes a pulse voltage (AC voltage) to a DC, and when the second half bridge circuit 922 is configured in an input side, the capacitor C8 serves to remove a ripple component of the second DC voltage Vo2.

Driving signals S19 to S22 such as, for example, a phase shift signal, and a PWM signal may be separately applied to gates of the transistors Q19 to Q22. Further, a PFM signal obtained by modulating a pulse frequency, rather than the phase shift signal or the PWM signal, may also be applied. Also, for example, when the second half bridge circuit 922 is configured in a smoothing circuit, i.e., in an output side, a simple high level or low level, rather than a phase shift signal, a PWM signal, or a PFM signal, is applied to the transistors Q21 and Q22, operations of the transistors Q21 and Q22 are always blocked, and a smoothing circuit may be configured by using a so-called body diode parasitically existing in those transistors.

Figure 11:
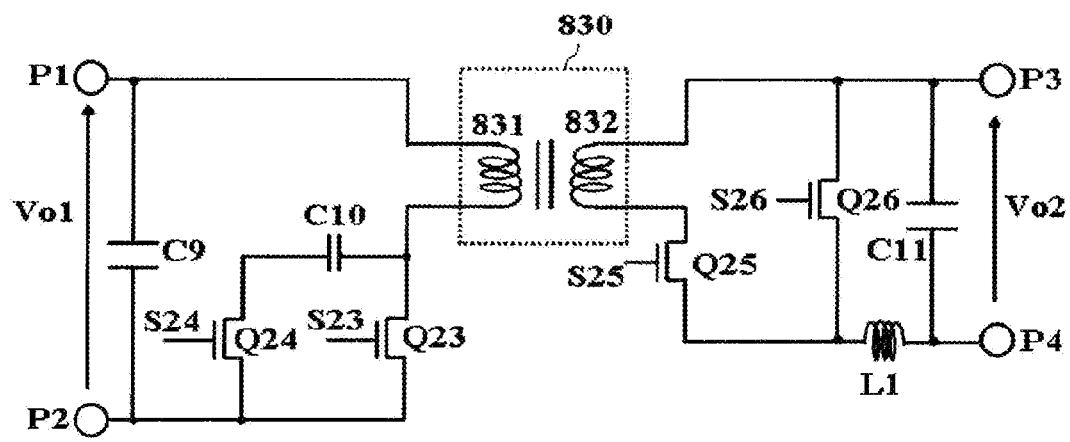
FIG. 11 is a view illustrating an active-clamp type switching power control circuit as a control scheme, according to an embodiment of the present disclosure.

FIG. 11 illustrates an active-clamp type switching power control circuit that can be applicable as a control scheme of the present disclosure. The active-clamp type belongs to a forward-type converter and is widely used in medium-capacity switching power supply devices ranging from tens of watts to hundreds of watts.

An active-clamp type switching power supply device 930 used as a control scheme of the present disclosure includes transistors Q23 and Q24, capacitors C7 and C8, and terminals P1 and P2 at a primary winding 831 side of a transformer 830. A first DC voltage Vo1 is supplied between the terminal P1 and the terminal P2. The transistor Q23 is a main switching element of the active-clamp type switching power supply device 930 and the transistor Q24 is an auxiliary switching element thereof and plays their respective roles.

The transistor Q24 and the capacitor C10 are connected in series. A scheme that does not use the transistor Q24 and the capacitor C10 is generally called a forward-type converter. The active-clamp type corresponds to one of forward-type converters in a broad sense.

The series connection body including the transistor Q24 and the capacitor C10, and the transistor Q23 are connected in parallel. When the transistor Q23 is in an OFF state, the transistor Q24 is turned on to reset the primary winding 831 of a transformer 830 to thereby prevent magnetization of a core of the transformer.

Signals having a modulated pulse width, for example, PWM driving signals S23 and S24 are applied to gates of the transistors Q23 and Q24. The driving signals S23 and S24 set with a predetermined dead time and a predetermined duty ratio are separately applied such that the transistor Q23 and the transistor Q24 are not simultaneously turned on. The capacitor S9 is provided to smooth the first DC voltage V1.

A smoothing circuit including transistors Q25 and Q26, a coil L1, and a capacitor C11 is installed in a secondary winding 832 of the transformer 830. The PWM driving signals S25 and S26 are separately applied, for example, such that the transistor Q25 and the transistor Q26 perform an operation of a so-called synchronization rectifying, that is, the transistor Q25 and the transistor Q26 are alternately turned on and off. A second DC voltage Vo2 is extracted between the terminal P3 and the terminal P4.

The active-clamp type switching power supply device 930 illustrated in FIG. 11 shows conversion of the first DC voltage Vo1 into the second DC voltage Vo2 uni-directionally, i.e., from the primary winding 831 toward the secondary winding 832. However, it is relatively easy for a person skilled in the art to configure a two-way switching power control circuit including a full bridge circuit, a half bridge circuit, and the like at the secondary winding 832 side.

Figure 12A:
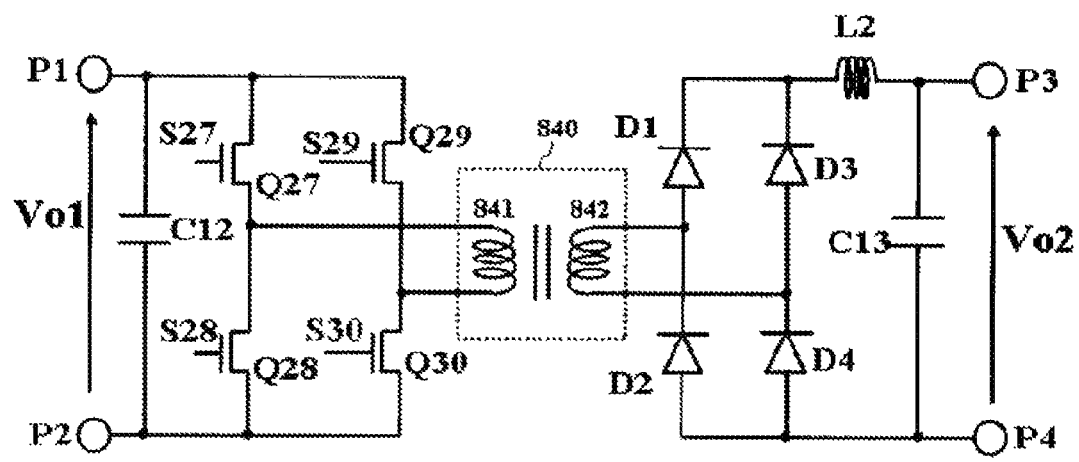
FIG. 12A is a view illustrating a chopper-type switching power control circuit as a control scheme, according to an embodiment of the present disclosure.

FIG. 12A schematically illustrates a chopper-type switching power supply device 940 that may be used in other control schemes of the present disclosure. A chopper-type switching power supply device 940 includes terminals P1 and P2, transistors Q27 to Q30, and a capacitor C12 connected to a primary winding 841 of a transformer 840. A first DC voltage Vo1 is supplied between the terminal P1 and the terminal P2.

The transistor Q27 and the transistor Q28 are connected in series between the terminal P1 and the terminal P2. The transistor Q29 and the transistor Q30 are connected in series and connected between the terminal P1 and the terminal P2. Thus, a series connection body of the transistors Q27 and Q28 and a series connection body of the transistors Q29 and Q30 are coupled in parallel between the terminal P1 and the terminal P2.

The primary winding 841 is coupled between a common node between the transistor Q27 and the transistor Q28 and a common node between the transistor Q29 and the transistor Q30. The capacitor C12 is connected as a smoothing capacitor between the terminal P1 and the terminal P2. A first DC voltage Vo1 is supplied between the terminal P1 and the terminal P2.

A diode rectifying circuit including diodes D1 to D4, a coil L2, and a capacitor C13 are connected to a secondary winding 842 side of the transformer 840, and terminals P3 and P4 are also connected thereto. An output from the diode rectifying circuit is connected in parallel to a series connection body of the output coil L2 and the capacitor C13. The terminal P3 is connected to a common node of the coil L2 and the capacitor C13, and a second DC voltage Vo2 generated between the terminal P3 and the terminal P4 is extracted.

The chopper-type switching power supply device 940 illustrated in FIG. 12A uses the transformer 840. However, since the configuration including the transistors Q27 to Q30 illustrated in FIG. 12A repeatedly uses ON/OFF such that the transistors Q27 and Q30 are simultaneously turned on or off or the transistors Q29 and Q28 are simultaneously turned on, it is called a chopper type. Further, the circuit configuration of the transistors Q27 to Q30 may also be used in a full bridge type or half bridge type by setting the driving signals S27 to S30.

Figure 12B:
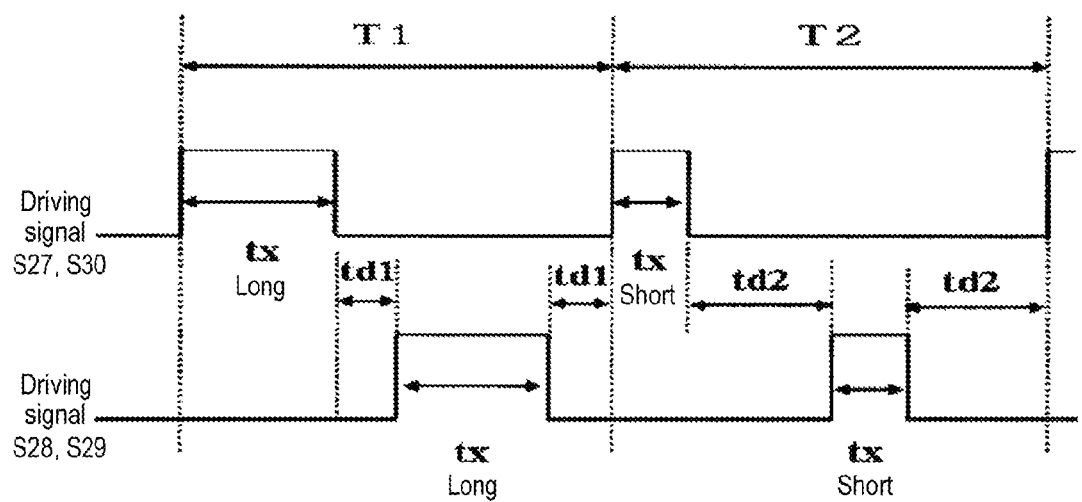
FIG. 12B is a view illustrating waveforms of driving signals applied to a gate of each transistor of FIG. 12A.

FIG. 12B illustrates driving signals applied to the transistors Q27 to Q30 of the switching power supply device 940 illustrated in FIG. 12A. The driving signal S27 and the driving signal S30 are identical, and the driving signal S28 and the driving signal S29 are identical. The driving signal S27 is applied to a gate of the transistor Q27, and the driving signal S30 is applied to a gate of the transistor Q30.

The driving signal S28 is applied to a gate of the transistor Q28 and the driving signal S29 is applied to a gate of the transistor Q29. Between the driving signals S27 and S30 and the driving signals S28 and S29, a dead time td1 is set in a period T1 and a dead time td2 is set in a period T2. The dead time td1 and the dead time td2 are set such that the transistor Q27 and the transistor Q28 are not simultaneously turned on and the transistor Q29 and the transistor Q30 are not simultaneously turned on. Setting such dead time is well known to a person skilled in the art.

It is illustrated that an ON duty tx is set to be relatively long during the period T1. The ON duty tx is set to be long when the second DC voltage Vo2 extracted between the terminal P3 and the terminal P4 is increased.

It is illustrated that an ON duty tx is set to be relatively short during the period T2. The ON duty tx is set to be short when the second DC voltage Vo2 extracted between the terminal P3 and the terminal P4 is reduced. By adjusting a time during which the transistors Q27 to Q30 are turned on, the first DC voltage Vo1 is converted into the predetermined second DC voltage Vo2.

Figure 13:
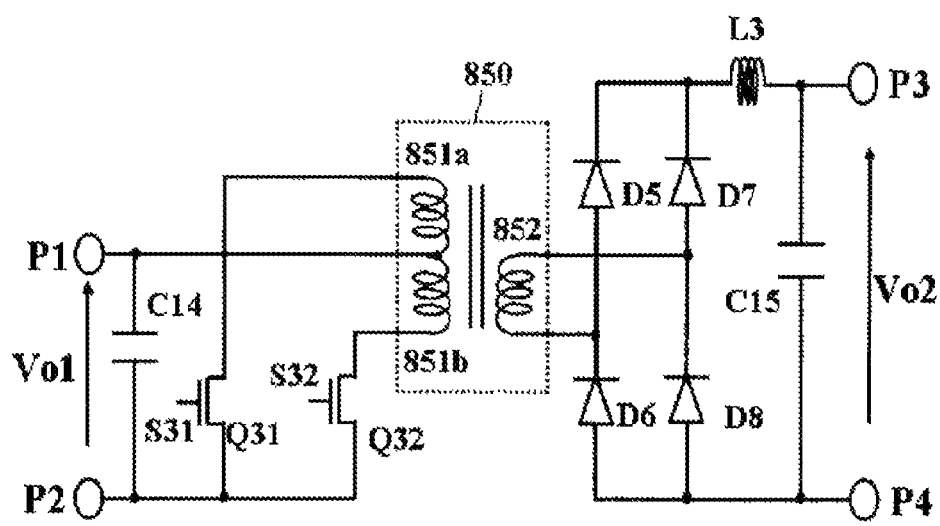
FIG. 13 is a view illustrating a push pull-type switching power control circuit as a control scheme, according to an embodiment of the present disclosure.

FIG. 13 illustrates a push pull-type switching power control circuit as one of control scheme select targets of the present disclosure. A push pull switching power supply device 950 includes transistors Q31 and Q32, a capacitor C14, and terminals P1 and P2 at primary windings 851a and 851b side of a transformer 850. A first DC voltage Vo1 is supplied between the terminal P1 and the terminal P2. The primary windings 851a and 851b are connected in series so that first terminals of the primary windings 851a and 851b are commonly connected and a second terminal of the primary winding 851a is connected to, for example, a drain of the transistor Q31 and a second terminal of the primary winding 851b is connected to, for example, a drain of the transistor Q32. The capacitor C14 is connected between the terminal P1 and the terminal P2. Driving signals S31 and S32 for alternately turning on and off the transistors Q31 and Q32 are applied thereto.

A smoothing circuit including diodes D5 to D8, a coil L3, and a capacitor C15 is installed in a secondary winding 852 side of the transformer 850. A second DC voltage Vo2 is output to terminals P3 and P4.

In the push pull-type switching power supply device 950 illustrated in FIG. 13, a voltage is transmitted uni-directionally, and the second DC voltage Vo2 is extracted by bucking or boosting the first DC voltage Vo1 supplied between the terminals P1 and P2. However, it is easy for a person skilled in the art that to configure a different type switching power control circuit by coupling a circuit such as a full bridge-type circuit, a half bridge-type circuit, or an active-clamp type circuit to the primary windings 851a and 851b side and the secondary winding 852 side.

According to the present disclosure in some embodiments, it is possible to provide a switching power control circuit capable of switching one of a plurality of control schemes by a single IC by setting various parameters of the digital compensator and the pulse generating circuit to predetermined values through a relatively simple operation without increasing a size of the circuit.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A switching power control circuit, comprising:
   an analog-to-digital converter (ADC) configured to convert an analog direct current (DC) voltage into a digital voltage;
   a digital compensator configured to set a gain and phase characteristics of the digital voltage output from the ADC and output a digital compensation value; and
   a pulse generating circuit configured to generate at least one driving signal based on the digital compensation value,
   wherein the pulse generating circuit is switched by an ON/OFF signal for turning on or off an output of the driving signal from the pulse generating circuit and a control scheme selection signal for selecting a predetermined driving signal from the driving signal,
   wherein the pulse generating circuit is turned off by the ON/OFF signal,
   wherein the control scheme selection signal is applied to the pulse generating circuit after the pulse generating circuit is turned off, and
   wherein the pulse generating circuit is turned on by the ON/OFF signal after the control scheme selection signal is applied to the pulse generating circuit.

2. The switching power control circuit of claim 1, further comprising:
   a digital-to-analog converter (DAC) configured to convert the digital compensation value output from the digital compensator into an analog compensation value; and
   a comparator configured to compare the analog compensation value with a current flowing in a switching element,
   wherein the DAC and the comparator are connected between the digital compensator and the pulse generating circuit, and
   wherein an output from the comparator is input to the pulse generating circuit.

3. The switching power control circuit of claim 1, wherein the analog DC voltage includes a first DC voltage and a second DC voltage,
   wherein the first DC voltage is input to a first input of a selecting circuit through a first ADC and the second DC voltage is input to a second input of the selecting circuit through a second ADC, and
   wherein one of the first DC voltage and the second DC voltage is input to the digital compensator by a switching operation of the selecting circuit.

4. The switching power control circuit of claim 1, wherein the analog DC voltage includes a first DC voltage and a second DC voltage,
   wherein the first DC voltage is input to a first contact of a switch and the second DC voltage is input to a second contact of the switch, and
   wherein one of the first DC voltage and the second DC voltage is input to the digital compensator by a switching operation of the switch.

5. The switching power control circuit of claim 1, wherein the digital compensator includes a proportional integral (PI) control circuit.

6. The switching power control circuit of claim 1, further comprising a first register and a second register,
   wherein the gain and phase characteristics are temporarily stored in the first register and transmitted to the digital compensator from the first register, and
   wherein a frequency of the driving signal generated by the pulse generating circuit and a dead time are temporarily stored in the second register.

7. The switching power control circuit of claim 6, wherein the gain and phase characteristics temporarily stored in the first register and the frequency and the dead time temporarily stored in the second register are transmitted from a microcomputer.

8. The switching power control circuit of claim 6, further comprising a non-volatile memory,
   wherein the gain and phase characteristics temporarily stored in the first register and the frequency and the dead time temporarily stored in the second register are transmitted from the non-volatile memory.

9. The switching power control circuit of claim 8, further comprising a data reading circuit,
   wherein the data reading circuit is installed between the non-volatile memory and the registers,
   wherein the gain and phase characteristics to be set in the digital compensator and the frequency of the driving signal and the dead time to be set in the pulse generating circuit are temporarily stored in the first register and the second register from the non-volatile memory by the data reading circuit,
   wherein the gain and phase characteristics are transmitted to the digital compensator from the first register and set in the digital compensator, and
   wherein the frequency of the driving signal and the dead time are transmitted to the pulse generating circuit from the second register and set in the pulse generating circuit.

10. The switching power control circuit of claim 9, wherein the control scheme selection signal is input to both of the pulse generating circuit and the data reading circuit.

11. The switching power control circuit of claim 10, wherein the data reading circuit includes an upper address for selecting a control scheme, and wherein the upper address is designated to read a specified control scheme selection signal from among a plurality of candidate control scheme selection signals.

12. The switching power control circuit of claim 11, wherein the data reading circuit includes a lower address, and wherein the lower address is designated to read the gain and phase characteristics to be set in the digital compensator and the frequency of the driving signal and the dead time to be set in the pulse generating circuit.

13. The switching power control circuit of claim 12, wherein the gain and phase characteristics, the frequency of the driving signal, and the dead time are stored in the nonvolatile memory according to the control scheme.

14. The switching power control circuit of claim 1, wherein the driving signal output from the pulse generating circuit includes at least one of a phase shift signal, a synchronization rectified signal, a PWM signal, and a PFM signal.

15. The switching power control circuit of claim 14, wherein at least one signal is selected from the phase shift signal, the synchronization rectified signal, the PWM signal, and the PFM signal, and the at least one selected signal is used as the driving signal for controlling at least one of a full bridge scheme, a half bridge scheme, an active-clamp scheme, a chopper scheme, and a push pull scheme.

16. The switching power control circuit of claim 15, wherein the switching power control circuit is configured to bi-directionally deliver a first DC voltage or a second DC voltage produced based on the first DC voltage, and
wherein at least one control scheme selected from the full bridge scheme, the half bridge scheme, the active-clamp scheme, the chopper scheme, and the push pull scheme is used for at least one of the first DC voltage and the second DC voltage.

* * * * *